(12) United States Patent
Yang et al.

(10) Patent No.: US 6,433,524 B1
(45) Date of Patent: Aug. 13, 2002

(54) RESISTIVE BRIDGE INTERFACE CIRCUIT

(75) Inventors: Xiaofeng Yang, Broadview Heights; Michael Nagy, Lakewood, both of OH (US)

(73) Assignee: Rosemount Aerospace Inc., Burnsville, MN (US)

( * ) Notice: Subject to any disclaimer, the term of this patent is extended or adjusted under 35 U.S.C. 154(b) by 0 days.

(21) Appl. No.: 09/809,552

(22) Filed: Mar. 15, 2001

(51) Int. Cl.$^7$ .............................. G05F 1/40; G05F 1/44
(52) U.S. Cl. ...................... 323/282; 323/285; 323/288; 323/274
(58) Field of Search ................... 323/282, 288, 323/285, 273, 274, 284

(56) References Cited

U.S. PATENT DOCUMENTS

| | | | |
|---|---|---|---|
| 3,609,728 A | * 9/1971 | Quinn .......................... 340/206 |
| 3,702,921 A | * 11/1972 | Thelen ......................... 219/501 |
| 3,747,009 A | * 7/1973 | Funke .......................... 330/146 |
| 3,940,679 A | 2/1976 | Brandwein et al. ............ 320/48 |
| 4,042,881 A | 8/1977 | Webb, Jr. .................. 324/123 R |
| 4,063,163 A | 12/1977 | Vitins ........................... 324/52 |
| 4,100,484 A | 7/1978 | Buchheit ....................... 324/32 |
| 4,226,692 A | 10/1980 | Isenberg ................. 204/195 S |
| 4,257,034 A | 3/1981 | Wilkinson ............ 340/347 NT |
| 4,263,622 A | 4/1981 | Hinn .......................... 358/242 |
| 4,463,306 A | 7/1984 | de Mello et al. ............. 322/25 |
| 4,467,662 A | 8/1984 | Valdemarsson ......... 73/862.69 |
| 4,517,513 A | 5/1985 | Brown .................... 324/117 R |
| 4,556,846 A | 12/1985 | D'Hondt ..................... 324/238 |
| 4,591,783 A | 5/1986 | Mastner ...................... 324/126 |
| 4,679,433 A | 7/1987 | Clinton et al. ............. 73/304 C |
| 4,737,879 A | 4/1988 | Andersson et al. ........... 361/80 |
| 4,785,236 A | 11/1988 | Balogh et al. .............. 324/120 |
| 4,795,973 A | 1/1989 | Smith-Vaniz et al. ....... 324/126 |
| 4,837,504 A | 6/1989 | Baer et al. .................. 324/142 |
| 4,850,370 A | 7/1989 | Dower ........................ 128/699 |
| 4,947,454 A | 8/1990 | Garner ........................ 455/84 |
| 5,005,146 A | 4/1991 | Lakatos et al. ............. 364/573 |
| 5,128,608 A | 7/1992 | Ochi ............................. 24/96 |
| 5,132,610 A | 7/1992 | Ying-Chang ................ 324/142 |
| 5,181,026 A | 1/1993 | Granville ............... 340/870.28 |
| 5,196,941 A | 3/1993 | Altmanshofer ............. 358/242 |
| 5,227,760 A | 7/1993 | Kobayashi .................... 338/2 |
| 5,250,893 A | 10/1993 | Gambill et al. ............. 324/115 |
| 5,291,534 A | 3/1994 | Sakurai et al. ................ 377/20 |
| 5,291,777 A | 3/1994 | Chang et al. ................. 73/151 |
| 5,305,760 A | 4/1994 | McKown et al. ........... 128/692 |
| 5,333,390 A | 8/1994 | Petterson et al. ............ 33/706 |
| 5,343,404 A | 8/1994 | Girgis ........................ 364/484 |
| 5,343,755 A | 9/1994 | Huss .......................... 73/708 |
| 5,418,453 A | 5/1995 | Wise .......................... 324/160 |
| 5,425,052 A | 6/1995 | Webster et al. ............. 375/224 |

(List continued on next page.)

OTHER PUBLICATIONS

Listing of articles produced in a search of NERAC Databases James W. Nilsson, "Electric Circuits", 1986, pp. 61–69.

*Primary Examiner*—Bao Q. Vu
(74) *Attorney, Agent, or Firm*—Thompson Hine LLP

(57) ABSTRACT

A resistive bridge interface circuit includes: (a) a pair of input power terminals; and (b) a resistive bridge circuit that includes a pair of parallel resistive branches coupled between the pair of input power terminals; (c) where each resistive branch of the resistive bridge interface circuit includes a voltage output terminal and a switch incorporated in series with the resistive branch; and (d) where each switch is activated at a duty cycle. In one embodiment, at least one of the resistive branches includes a variable resistor incorporated in series therewith. In an alternate embodiment, each resistive branch includes a variable resistor incorporated in series therewith, where such variable resistors vary in response to an environmental condition (such as strain experienced by the variable resistors) in opposite directions with respect to each other.

27 Claims, 3 Drawing Sheets

U.S. PATENT DOCUMENTS

| | | |
|---|---|---|
| 5,436,953 A | 7/1995 | Nilson .......................... 379/27 |
| 5,445,006 A | 8/1995 | Allen et al. ................... 73/1 D |
| 5,458,142 A | 10/1995 | Farmer et al. ............ 128/653.1 |
| 5,465,604 A | 11/1995 | Sherman .................... 73/1 DV |
| 5,511,223 A | 4/1996 | Scecina et al. ............. 395/800 |
| 5,524,484 A | 6/1996 | Sullivan ....................... 73/168 |
| 5,541,510 A | 7/1996 | Danielson ................... 324/233 |
| 5,608,324 A | 3/1997 | Yoshida ....................... 324/426 |
| 5,668,320 A | 9/1997 | Cowan ......................... 73/708 |
| 5,681,997 A | 10/1997 | McHale et al. ................ 73/727 |
| 5,877,637 A * | 3/1999 | Trofimenkoff et al. ...... 327/101 |
| 5,909,132 A * | 6/1999 | Trofimenkoff et al. ...... 327/101 |
| 6,147,312 A | 11/2000 | Lockery ..................... 177/211 |

\* cited by examiner

RESISTIVE BRIDGE INTERFACE CIRCUIT

BACKGROUND

The present invention relates to a resistive bridge interface circuit; and more particularly, to a resistive bridge interface circuit with reduced power consumption.

As shown in FIG. 1, a conventional resistive bridge interface circuit 10 for use with a strain gage, for example, is a conventional Wheatstone bridge configuration. The Wheatstone bridge interface circuit 10 includes two arms 12, 14 coupled in parallel between the input power terminals VDD 16 and Ground 18. The first arm 12 includes resistors R1 20 and R2 22 connected in a series and the second arm 14 includes resistors R3 24 and R4 26 connected in series. A first voltage output terminal V1 28 is positioned between the two resistors R1 20 and R2 22 in the first arm 12, and a second voltage output terminal V2 30 is positioned in series between the two resistors R3 24 and R4 26 of the second arm 14. When used as an interface circuit of a strain gage, the resistors R1 20, R2 22, R3 24 and R4 26 are variable resistors disposed upon a diaphragm, where the resistance of such resistors vary with the tensile strain experienced by the resistors. These resistor all have substantially the same initial resistance value. Resistors R1 20 and R4 26 both vary in a first direction in response to the strain experienced thereby; and resistors R2 22 and R3 24 vary in an opposite direction in response to the strain experienced thereby. The magnitude of variance experienced by each resistors in response to the strain experienced by each resistors is substantially the same. Accordingly, if the diaphragm experiences strain, resistors R1 20 and R4 26 may experience a decrease in resistance while resistors R2 22 and R3 24 may experience a substantially identical increase in resistance. This in turn creates an imbalance across the bridge 10 such that when a voltage is applied at the input terminals VDD 16 and Ground 18, an output voltage $V_{out}$ occurs across output terminals V1 28 and V2 30, which is related to the movement of the diaphragm relative to the pressure being sensed. Assuming that the resistors have the same initial resistance, R, this output voltage $V_{out}$ can be expressed mathematically in accordance with the following equation $$V_{out} = \frac{\Delta R}{R} \cdot VDD.$$

If the power driving this interface circuit 10 is a DC power supply, the power consumption for this circuit is $VDD^2/R$. If the power supply is a square wave or sign wave signal, then a demodulation circuit is applied to obtain a DC output signal, and power consumption is only ½ of the power consumption as compared to the DC power supply.

SUMMARY

The present invention is directed to a resistive bridge interface circuit; and more particularly, to a resistive bridge interface circuit with relatively lower power consumption.

A first aspect of the present invention is directed to a resistive bridge interface circuit that includes: (a) a pair of input power terminals; and (b) a resistive bridge circuit that includes a pair of parallel resistive branches coupled between the pair of input power terminals; (c) where each resistive branch of the resistive bridge interface circuit includes a voltage output terminal and a switch incorporated in series with the resistive branch; and (d) where each switch is activated at a duty cycle.

In a more detailed embodiment of this first aspect of the present invention, at least one of the resistive branches includes a variable resistor incorporated in series therewith.

In an alternate detailed embodiment of this first aspect of the present invention, each resistive branch includes a variable resistors incorporated in series therewith, where such variable resistors vary in response to an environmental condition in opposite directions with respect to each other. In the more detailed embodiment, the environmental condition is strain experienced by the variable resistors.

In another alternate embodiment of the first aspect of the present invention, the resistive bridge interface circuit further includes a differentiator operatively coupled to the voltage output terminals. In a more detailed embodiment, the differentiator is a switched-capacitor differential amplifier circuit.

It is a second aspect of the present invention to provide a resistive interface circuit that includes: (a) first and second input power terminals; (b) first and second parallel branches coupled in series between the first and second input power terminals; (c) where the first branch includes a first voltage output terminal, a first current source coupled in series between the first input power terminal and the first voltage output terminal, a first resistor coupled in series between the first voltage output terminal and the second input power terminal, and a switch positioned in series between the first input power terminal and the first voltage output terminal; and (d) where the second branch includes a second voltage output terminal, a second resistor coupled in series between the first input power terminal and the second voltage output terminal, a second current source coupled in series between the second voltage output terminal in the second input power terminal, and a switch positioned in series between the second voltage output terminal and the second input power terminal. In a more detailed embodiment, the first and second switches are configured to be activated simultaneously. In a further detail of embodiment, the first and second switches are configured to be activated simultaneously at a relatively low duty cycle. In yet a further detailed embodiment, the first and second resistors are variable resistors. In yet a further detailed embodiment, the first and second resistors are adapted to vary proportionately with respect to each other in response to an environmental condition. In yet a further detailed embodiment, the first and second resistors vary in opposite directions with respect to each other. In yet a further detailed embodiment, the environmental condition varying the first and second resistors is strain experienced by the first and second resistors. In yet a first detailed embodiment, the first and second resistors have substantially the same initial resistance values. In yet a further detailed embodiment, the current source comprises a third resistor coupled in series between the first input power terminal and the first voltage output terminal, the second current source comprises a fourth resistor coupled in series between the second voltage output terminal and the second input power terminal, and the third and fourth resistors have substantially the same resistance values. In yet a further detailed embodiment, the third and fourth resistors are variable resistors with substantially the same initial resistance value as the first and second resistors and are adapted to vary and opposite directions with respect to each other in response to strain experienced by the third and fourth resistors. In yet a further detailed embodiment, the relatively low duty cycle is approximately a 15% duty cycle to approximately a 50% duty cycle.

In an alternate detailed embodiment to the second aspect of the present invention, the first and second resistors are variable resistors with substantially the same initial resistance value and vary proportionately in opposite directions with respect to each other in response to an environmental condition. In a further detailed embodiment, the first and second current sources respectively comprise third and fourth variable resistors with substantially the same initial resistance value of the first and second resistors and which vary proportionately in opposite directions with respect to each other in response to the environmental condition, and the first and third variable resistors vary proportionately in opposite directions with respect to each other in response to the environmental condition, and, likewise, the second and fourth variable resistors vary proportionately in opposite directions with respect to each other in response to the environmental condition. In yet a further detailed embodiment, the environmental condition is strain experienced by the first, second, third and fourth resistors.

In yet another alternate detailed embodiment of the second aspect of the present invention, the first and second switches are operatively coupled to, and activated by a single timing circuit.

In yet a further alternate detailed embodiment to the second aspect of the present invention, the first switch is coupled in series between the first input power terminal and the first current source, and the second switch is coupled in series between the second input power terminal and the second current source.

In yet a further detailed embodiment to the second aspect of the present invention, the first switch is coupled in series between the first current source in the first voltage output terminal and the second switch is coupled in series between the second current source and the second voltage output terminal.

In yet another alternate detailed embodiment of the second aspect of the present invention, the resistive bridge interface circuit further includes a differentiator operatively coupled to the first and second voltage output terminals. In a more detailed embodiment, the differentiator is a switched-capacitor differential amplifier.

DETAILED DESCRIPTION

Figure 2:
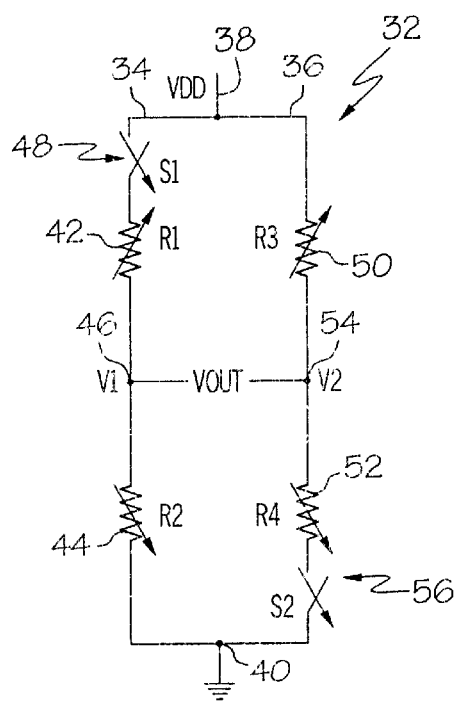
FIG. 2 illustrates a schematic design of a first exemplary embodiment of a resistive bridge interface circuit according to the present invention.

As shown in FIG. 2, a first exemplary embodiment of a resistive bridge interface circuit 32 according to the present invention includes a pair of resistive branches 34, 36 connected in parallel between a pair of voltage input terminals VDD 38 and Ground 40. The first resistive branch 34 includes a first variable resistor R1 42 and a second variable resistor R2 44 coupled in series between the input voltage terminals VDD 38 and GND 40; a first voltage output terminal V1 46 connected in series between the first and second resistors R1 42 and R2 44; and a first switch S1 48 coupled in series between the first resistor R1 42 and the first input voltage terminal VDD 38. The second branch 36 includes third and fourth variable resistors R3 50 and R4 52 coupled in series between the voltage input terminals VDD 38 and GND 40; a second voltage output terminal V2 54 coupled in series between the third and fourth resistors R3 50 and R4 52; and a second switch S2 56 coupled in series between the fourth resistors R2 44 R4 52 and the second voltage input terminal 40. In this exemplary embodiment, the first and third resistors R1 42 and R3 50 vary in a first direction in response to an environmental condition, such as strain experienced by the variable resistors; and the second and fourth resistors R2 44 and R4 52 vary in an opposite direction in response to the environmental condition experienced by the variable resistors.

Assuming that the initial values of the variable resistors are all the same, and equal to R, and the magnitude of resistance change upon experiencing the environmental condition is equal to ΔR, the amplitudes of the output terminals V1 28 and V2 30 are calculated as follows:

$$V1(\text{amplitude})=VDD(R2/(R1+R2))=VDD(R-\Delta R)/2R \qquad \text{Equ. 1}$$

$$V2(\text{amplitude})=VDD-VDD(R4/(R3+R4))=VDD(R3/(R3+R4))= \\ VDD(R+\Delta R)/2R \qquad \text{Equ. 2}$$

Figure 1:
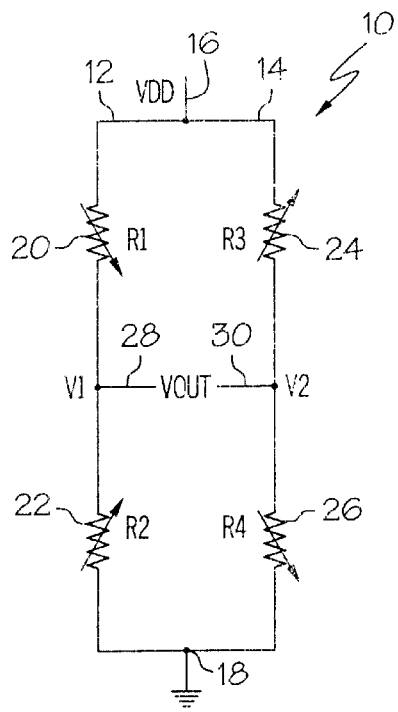
FIG. 1 illustrates a conventional Wheatstone bridge interface circuit.

V1 and V2 are 180° out of phase. In the present exemplary embodiment, power is consumed by the circuit 32 only when the switches 48, 56 are activated. Therefore, by utilizing a very low duty cycle switch control signal for simultaneously activating the switches 48, 56, a substantial amount of power can be saved in comparison to the prior art circuit as shown in FIG. 1. For example, if the switches 48, 56 were activated at a 1% duty cycle, 99% of the power consumption could be saved as compared to the DC powered circuit shown in FIG. 1.

Figure 3:
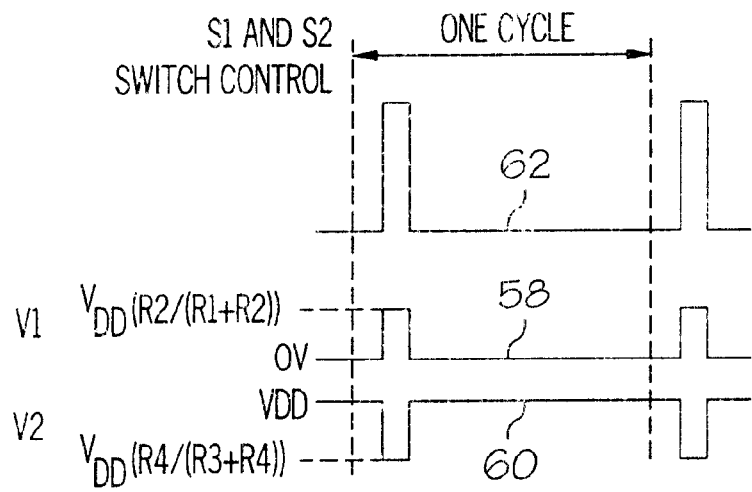
FIG. 3 illustrates an example timing diagram for the resistive bridge interface circuit of FIG. 2.

As shown in FIG. 3, the timing diagram illustrates the first and second voltage outputs V1 and V2 on lines 58 and 60, respectively, and illustrates the output of the switch activation signal for activating switches 48 and 56 on line 62.

Figure 4:
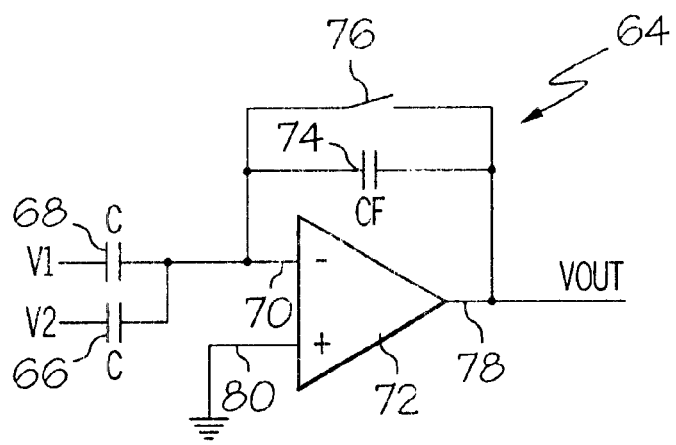
FIG. 4 illustrates a schematic design of a switched-capacitor differential amplifier for use with the present invention.

The voltage outputs V1 and V2 from the voltage output terminals 46 and 54, in the exemplary embodiment, are sent to a standard switched-capacitor differential amplifier circuit 64 as shown in FIG. 4. As shown in FIG. 4, in this standard switched-capacitor differential amplifier 64, the output voltages V1 and V2 are each coupled to a respective capacitor 66, 68, each having a capacitance value of C, which are, in turn, each coupled to an inverting input 70 of an operational amplifier device 72. A capacitor 74 having a capacitance of Cf and a switch 76 are coupled in parallel between the output 78 of the operational amplifier device 72 and the inverting input 70 of the operational amplifier device. The switch 76 is activated to reset the differentiator and is therefore activated when the switches S1 48 and S2 56 of the resistive bridges circuit 32 are deactivated. The non-inverting input 80 of the operational amplifier device is coupled to ground. The output voltage $V_{out}$ of this standard switch-capacitor differential amplifier 64 is calculated as follows:

$$V_{out} = VDD \cdot \frac{\Delta R}{R} \cdot \frac{C}{C_f} \qquad \text{Equ. 3}$$

This signal $V_{out}$ is a discrete analog signal. A switched-capacitor analog to digital converter may then be used to convert this output signal to a digital signal, or a conventional sample-and-hold circuit may be used to convert this output signal to a continuous analog signal.

Figure 5:
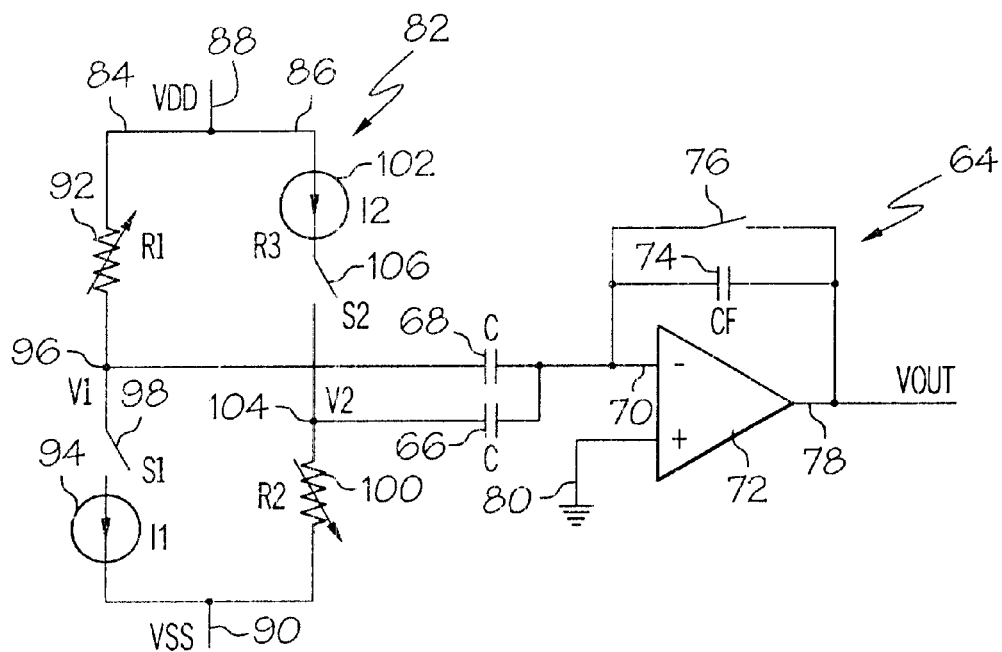
FIG. 5 illustrates another exemplary embodiment of a resistive bridge interface circuit coupled to a differential amplifier circuit according to the present invention.

As shown in FIG. 5, an alternate design for the resistive bridge interface circuit 82 according to the present invention includes first and second resistive branches 84, 86 connected in parallel between first and second voltage input terminals, VDD 88 and VSS 90. The first branch 84 includes a first resistor R1 92 and a first current source I1 94 coupled in series between the first and second voltage input terminals VDD 88 and VSS 90; a first voltage output terminal V1 96 coupled in series between the first resistor R1 92 and the first current source 94; and a first switch S1 98 coupled in series between the first voltage output terminal 96 and the first current source I1 94. The second branch 86 includes a second resistor R2 100 and second current source I2 102 coupled in series between the first and second voltage input terminals VDD 88 and VSS 90; a second voltage output terminal V2 104 coupled in series between the second resistor R2 100 and the second current source I2 102; and second switch S2 106 coupled in series between the second voltage output source V2 104 and the second current source I2 102. Both the first and second resistors 92, 100 can be variable resistors, such as strain gages, or one of the resistors can be a strain gage while the other is a fixed reference resistor. If both resistors 92, 100 are variable resistors, their resistance values will change in opposite directions under the same environmental condition, such as stress.

In this exemplary embodiment, the current sources I1 94 and I2 102 are regulated current sources and the two constant currents provided by the current sources 94, 102 to the respective first and second variable resistors R1 92, and R2 100 have substantially the same value; and the first and second variable resistors R1 92 and R2 100 have the same nominal resistance value R, which varies at substantially the same resistance magnitude in response to the environmental condition, such as strain (changing in opposite directions as mentioned above). Therefore, under such environmental conditions the resistance value of the first resistor R1 92 becomes R+ΔR and the resistance value of the second resistor R2 100 becomes R−ΔAR. Therefore, the output voltages at the first and second output terminals V1 96 and V2 104 will be 180° out of phase, with amplitudes that change substantially equally in opposite directions. As with the first embodiment, the first and second switches S1 98 and S2 106 are activated simultaneously at relatively low duty cycle so that the present circuit 82 consumes less power than the conventional Wheatstone bridge circuit as shown in FIG. 1. As with the first exemplary embodiment, the first and second voltage output terminal is V1 96 and V2 104 are each coupled to a conventional switched-capacitor differential amplifier 64. With such a configuration, the voltage amplitude of the output signal $V_{out}$ (a discrete time analog signal) at the output terminal 72 of the switched-capacitor differential amplifier 64 is:

$$Vout = (I(R + \Delta R) - I(R - R\Delta))\frac{C}{Cf} = 2I\Delta R \frac{C}{Cf} \qquad \text{Equ. 4}$$

Figure 6:
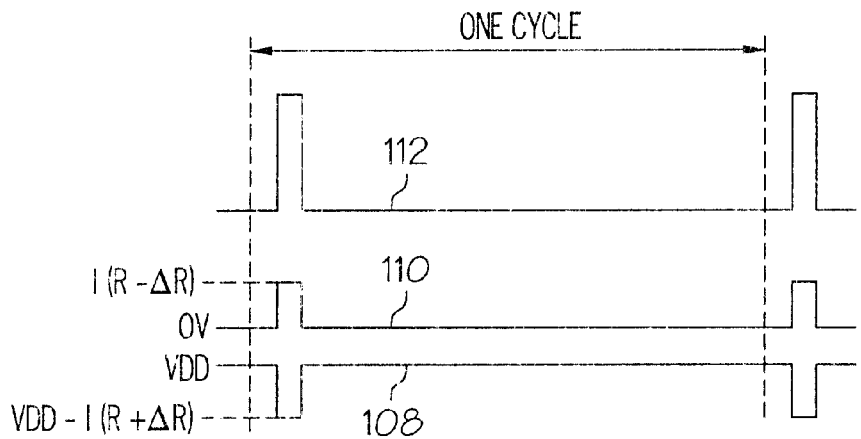
FIG. 6 illustrates an example timing diagram for the circuit provided in FIG. 4.

As shown in FIG. 6, the timing diagrams for the first voltage output terminal V1 96 is illustrated in line 108, the timing diagram at the second voltage output terminal V2 104 is shown by line 110, in the timing diagram for the switch control signal for simultaneously activating the switches S1 98 and S2 106 is shown by line 112.

Following from the above description and summary, it should be apparent to those of ordinary skill in the art that, while the apparatuses and processes herein described constitute exemplary embodiments of the present invention, it is to be understood that the invention is not limited to these precise apparatuses and processes and that changes may be made therein within departing from the scope of the invention as defined by the claims. Additionally, it is to be understood that the invention is defined by the claims and it is not intended that any limitations or elements describing the exemplary embodiments herein are to be incorporated into the meanings of the claims unless such limitations or elements are specifically listed in the claims. Likewise, it is to be understood that it is not necessary to meet any or all of the identified advantages or objects of the present invention disclosed herein in order to fall within the scope of the claims, since the invention is defined by the claims and since inherent and/or unforeseen advantages of the present invention may exist even though they may not be explicitly discussed herein.

What is claimed:

1. A resistive bridge interface circuit comprising:
   a pair of input power terminals;
   a resistive bridge circuit including a pair of parallel resistive branches coupled between the pair of input power terminals;
   each resistive branch of the resistive bridge circuit including a voltage output terminal and a switch incorporated in series with the resistive branch;
   each switch being activated at a duty cycle.

2. The resistive bridge interface circuit of claim 1, wherein at least one resistive branch includes a variable resistor incorporated in series with the resistive branch.

3. The resistive bridge interface circuit of claim 1, wherein each resistive branch includes a variable resistor incorporated in series with the respective resistive branch, and the variable resistors vary in response to an environmental condition in opposite directions with respect to each other.

4. The resistive bridge interface circuit of claim 3, wherein the environmental condition is strain experienced by the variable resistors.

5. The resistive bridge interface circuit of claim 1, further comprising a differentiator operatively coupled to the voltage output terminals.

6. The resistive bridge interface circuit of claim 5, wherein the differentiator is a switched-capacitor differential amplifier circuit.

7. A resistive bridge interface circuit comprising:
   first and second input power terminals;
   first and second parallel branches coupled in series between the first and second input power terminals;
   the first branch including a first voltage output terminal, a first current source coupled in series between the first input power terminal and the first voltage output terminal, a first resistor coupled in series between the first voltage output terminal and the second input power terminal, and a switch positioned in series between the first input power terminal and the first voltage output terminal; and
   the second branch including a second voltage output terminal, a second resistor coupled in series between the first input power terminal and the second voltage output terminal, a second current source coupled in series between the second voltage output terminal and the second input power terminal, and a switch positioned in series between the second voltage output terminal and the second input power terminal.

8. The resistive bridge interface circuit of claim 7, wherein the first and second switches are configured to be activated simultaneously.

9. The resistive bridge interface circuit of claim 8, wherein the first and second switches are configured to be activated simultaneously at a relatively low duty cycle.

10. The resistive bridge interface circuit of claim 9, wherein the first and second resistors are variable resistors.

11. The resistive bridge interface circuit of claim 10, wherein the first and second resistors are adapted to vary proportionately with respect to each other in response to an environmental condition.

12. The resistive bridge interface circuit of claim 11, wherein the first and second resistors vary in opposite directions with respect to each other.

13. The resistive bridge interface circuit of claim 12, wherein the environmental condition varying the first and second resistors is strain experience by the first and second resistors.

14. The resistive bridge interface circuit of claim 13, wherein the first and second resistors have substantially the same initial resistance values.

15. The resistive bridge interface circuit of claim 14, wherein:
the current source comprises a third resistor coupled in series between the first input power terminal and the first voltage output terminal;
the second current source comprises a fourth resistor coupled in series between the second voltage output terminal and the second input power terminal; and
the third and fourth resistors have substantially the same resistance values.

16. The resistive bridge interface circuit of claim 15, wherein the third and fourth resistors are variable resistors with substantially the same initial resistance value as the first and second resistors and are adapted to vary in opposite directions with respect to each other in response to strain experienced by the third and fourth resistors.

17. The resistive bridge interface circuit of claim 16, wherein the relatively low duty cycle is approximately a 15% duty cycle to approximately a 50% duty cycle.

18. The resistive bridge interface circuit of claim 7, wherein the first and second resistors are variable resistors with substantially the same initial resistance value and varying proportionately in opposite directions with respect to each other in response to an environmental condition.

19. The resistive bridge interface circuit of claim 18, wherein:
the first and second current sources respectively comprise third and fourth variable resistors with substantially the same initial resistance value of the first and second resistors and varying proportionately in opposite directions with respect to each other in response to the environmental condition; and
the first and third variable resistors vary proportionately in opposite directions with respect to each other in response to the environmental condition, and, likewise, the second and fourth variable resistors vary proportionately in opposite direction with respect to each other in response to the environmental condition.

20. The resistive bridge interface circuit of claim 19, wherein the environmental condition is strain experienced by the first, second, third and fourth resistors.

21. The resistive bridge interface circuit of claim 7, wherein the first and second switches are each operatively coupled to, and activated by a single timing circuit.

22. The resistive bridge interface circuit of claim 7, wherein:
the first switch is coupled in series between the first input power terminal and first current source; and
the second switch is coupled in series between the second input power terminal and the second current source.

23. The resistive bridge interface circuit of claim 7, wherein:
the first switch is coupled in series between the first current source and the first voltage output terminal; and
the second switch is coupled in series between the second current source and the second voltage output terminal.

24. The resistive bridge interface circuit of claim 7, further comprising comprising a differentiator operatively coupled to the first and second voltage output terminals.

25. The resistive bridge interface circuit of claim 24, wherein the differentiator is a switched-capacitor differential amplifier circuit.

26. A resistive bridge interface circuit comprising:
a pair of input power terminals;
a resistive bridge circuit including a pair of parallel resistive branches coupled between the pair of input power terminals, each resistive branch of the resistive bridge circuit including a voltage output terminal; and
at least one switch coupled in the resistive bridge interface circuit to control current flow through the resistive branches, the switch being activated at a duty cycle for controlling power consumption by the resistive bridge circuit.

27. The resistive bridge interface circuit of claim 26, further comprising a differentiator operatively coupled to the voltage output terminals.

* * * * *